US012597945B2

(12) United States Patent
Jefremow et al.

(10) Patent No.: US 12,597,945 B2
(45) Date of Patent: Apr. 7, 2026

(54) MACHINE LEARNING ENHANCED RESOLVER SYSTEMS

(71) Applicant: Infineon Technologies AG, Neubiberg (DE)

(72) Inventors: Mihail Jefremow, Augsburg (DE); Juergen Schaefer, Oberhaching (DE); David Zipperstein, Munich (DE); Arndt Voigtlaender, Antdorf (DE)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 18/646,432

(22) Filed: Apr. 25, 2024

(65) Prior Publication Data

US 2025/0337434 A1     Oct. 30, 2025

(51) Int. Cl.
| | |
|---|---|
| *H03M 3/00* | (2006.01) |
| *G06N 3/0455* | (2023.01) |
| *G06N 3/088* | (2023.01) |

(52) U.S. Cl.
CPC .......... *H03M 3/458* (2013.01); *G06N 3/0455* (2023.01); *G06N 3/088* (2013.01)

(58) Field of Classification Search
CPC ........ H03M 3/00; H03M 3/458; G06N 3/088; G06N 3/0455
See application file for complete search history.

(56) References Cited

U.S. PATENT DOCUMENTS

| | | | | | |
|---|---|---|---|---|---|
| 5,396,244 | A | * | 3/1995 | Engel | ...................... H03F 3/217 341/143 |
| 6,208,279 | B1 | * | 3/2001 | Oprescu | ................ H03M 3/374 341/143 |
| 6,459,398 | B1 | * | 10/2002 | Gureshnik | .......... H03M 7/3008 341/145 |
| 6,853,836 | B2 | * | 2/2005 | Asam | ...................... H03C 5/00 370/347 |
| 7,420,498 | B2 | * | 9/2008 | Barrenscheen | .......... G06F 3/05 341/155 |

(Continued)

OTHER PUBLICATIONS

"DSADC: Delta-Sigma Analog-to-Digital Converter", Infineon Technologies AG, AURIX TC2xx Microcontroller Training V1.0, Mar. 27, 2019, 8 pp.

*Primary Examiner* — Lam T Mai

(74) *Attorney, Agent, or Firm* — Shumaker & Sieffert, P.A.

(57)     ABSTRACT

Processing circuitry comprising an analog-to-digital converter configured to perform the techniques of this disclosure. The analog-to-digital converter may obtain, based on electrical interactions with a resolver sensor, a noisy modulated digital cosine signal (NMDCS) and a noisy modulated digital sine signal (NMDSS). The processing circuitry includes a filter configured to process the NMDCS and the NMDSS to output a filtered NMDCS and a filtered NMDSS, and a rectifier configured to process the filtered NMDCS and the filtered NMDSS to output a rectified NMDCS and a rectified NMDSS. The processing circuitry includes a digital signal processor that executes a first trained machine learning model to process the rectified NMDCS and the rectified NMDSS to obtain a demodulated DCS and a demodulated DSS, and compute, based on the demodulated DCS and the demodulated DSS, an approximate angle of the rotating element.

20 Claims, 8 Drawing Sheets

(56)                References Cited

U.S. PATENT DOCUMENTS

| | | | | | |
|---|---|---|---|---|---|
| 7,456,603 | B2 * | 11/2008 | Kanekawa | ........... | H03M 1/485 |
| | | | | | 318/807 |
| 8,159,173 | B2 * | 4/2012 | Mori | ......................... | H02P 6/06 |
| | | | | | 361/239 |
| 9,455,733 | B1 * | 9/2016 | Wu | ...................... | H03M 1/0609 |
| 10,476,483 | B2 * | 11/2019 | Straeussnigg | ...... | H03H 17/0664 |
| 10,574,258 | B1 * | 2/2020 | Albel | ............... | H02M 7/53871 |
| 11,177,987 | B1 * | 11/2021 | Jefremow | ............... | H04L 27/08 |
| 2004/0190660 | A1 * | 9/2004 | Morris | .................... | H03M 3/47 |
| | | | | | 375/350 |
| 2008/0030391 | A1 * | 2/2008 | Games | .................. | G01D 5/244 |
| | | | | | 341/155 |
| 2010/0050731 | A1 * | 3/2010 | Granig | ................ | G01D 5/2449 |
| | | | | | 324/202 |
| 2013/0271155 | A1 * | 10/2013 | O'Keeffe | ............... | G01R 27/28 |
| | | | | | 324/607 |
| 2014/0185835 | A1 * | 7/2014 | Fraisse | ................. | H03F 3/2175 |
| | | | | | 381/119 |
| 2014/0333241 | A1 * | 11/2014 | Zhao | ....................... | H02P 27/08 |
| | | | | | 318/400.02 |
| 2015/0100264 | A1 * | 4/2015 | Qian | ....................... | H02P 21/18 |
| | | | | | 324/202 |
| 2015/0365099 | A1 * | 12/2015 | Saloio | ................. | G01D 5/2291 |
| | | | | | 341/141 |
| 2016/0109266 | A1 * | 4/2016 | Kudlu | ................. | G01D 5/2073 |
| | | | | | 324/207.25 |
| 2016/0245674 | A1 * | 8/2016 | Ausserlechner | ....... | G01D 11/24 |
| 2016/0248432 | A1 * | 8/2016 | Naderi Alizadeh | ... | H03M 1/002 |
| 2017/0242709 | A1 * | 8/2017 | Bodner | ................ | G06F 1/3287 |
| 2019/0058427 | A1 * | 2/2019 | Hafner | ................... | H02P 21/10 |
| 2021/0156664 | A1 * | 5/2021 | Binder | ................. | G01D 5/145 |
| 2021/0180938 | A1 * | 6/2021 | Hammerschmidt | . | G01R 33/091 |
| 2021/0247466 | A1 * | 8/2021 | Hammerschmidt | ..... | G01B 7/30 |
| 2022/0221308 | A1 * | 7/2022 | Heiling | ............... | G01D 5/2073 |
| 2022/0413462 | A1 * | 12/2022 | Wang | .................... | G05B 19/33 |
| 2024/0142503 | A1 * | 5/2024 | Wang | .................... | G01R 23/14 |
| 2024/0213897 | A1 * | 6/2024 | Hauer | ................... | H02P 21/18 |
| 2024/0213898 | A1 * | 6/2024 | Jefremow | .............. | H02P 21/09 |

* cited by examiner

Notes to draftperson:
(1) remove black arrows
(2) Remove all text except for graph units, "3ms," the "Reference Angle," "ANN solution," and "HW solution"

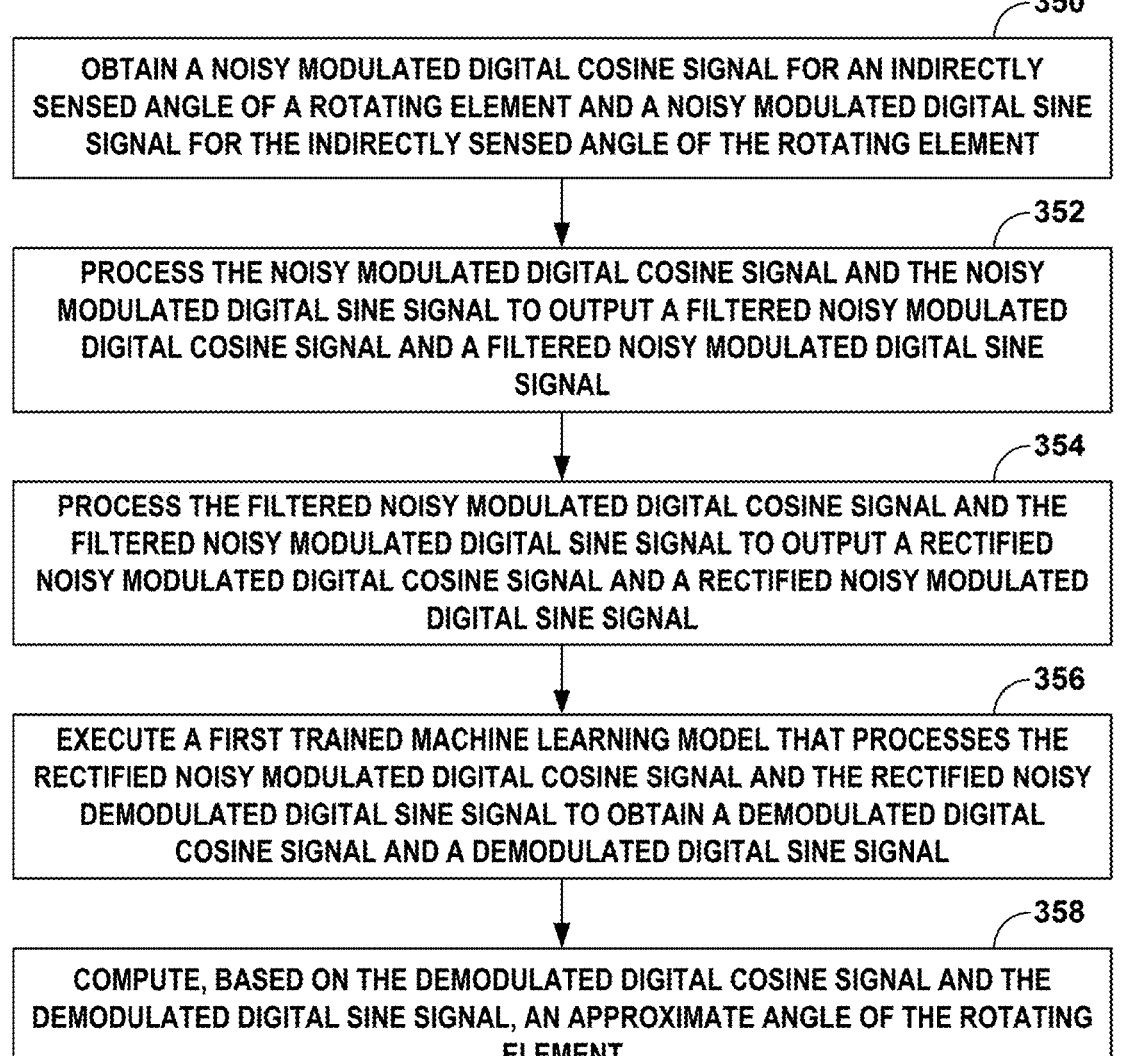

350

OBTAIN A NOISY MODULATED DIGITAL COSINE SIGNAL FOR AN INDIRECTLY
SENSED ANGLE OF A ROTATING ELEMENT AND A NOISY MODULATED DIGITAL SINE
SIGNAL FOR THE INDIRECTLY SENSED ANGLE OF THE ROTATING ELEMENT

352

PROCESS THE NOISY MODULATED DIGITAL COSINE SIGNAL AND THE NOISY
MODULATED DIGITAL SINE SIGNAL TO OUTPUT A FILTERED NOISY MODULATED
DIGITAL COSINE SIGNAL AND A FILTERED NOISY MODULATED DIGITAL SINE
SIGNAL

354

PROCESS THE FILTERED NOISY MODULATED DIGITAL COSINE SIGNAL AND THE
FILTERED NOISY MODULATED DIGITAL SINE SIGNAL TO OUTPUT A RECTIFIED
NOISY MODULATED DIGITAL COSINE SIGNAL AND A RECTIFIED NOISY MODULATED
DIGITAL SINE SIGNAL

356

EXECUTE A FIRST TRAINED MACHINE LEARNING MODEL THAT PROCESSES THE
RECTIFIED NOISY MODULATED DIGITAL COSINE SIGNAL AND THE RECTIFIED NOISY
DEMODULATED DIGITAL SINE SIGNAL TO OBTAIN A DEMODULATED DIGITAL
COSINE SIGNAL AND A DEMODULATED DIGITAL SINE SIGNAL

358

COMPUTE, BASED ON THE DEMODULATED DIGITAL COSINE SIGNAL AND THE
DEMODULATED DIGITAL SINE SIGNAL, AN APPROXIMATE ANGLE OF THE ROTATING
ELEMENT

FIG. 4

MACHINE LEARNING ENHANCED RESOLVER SYSTEMS

TECHNICAL FIELD

This disclosure relates to resolver systems for computing devices.

BACKGROUND

Processors, such as microcontrollers, are increasingly being deployed in industrial settings (e.g., for motor control and signal processing), vehicles (e.g., control of combustion engines, electric motors, electrical and hybrid vehicles, transmission control units, chassis domains, braking systems, electrical power steering systems, driver assistance systems, etc.), and the like. Microcontrollers may include hardware to implement resolver-to-digital converters (RDCs), which may refer to signal processing for resolving an angle and velocity of a rotating element. The RDCs may interface with a resolver sensor coupled to the rotating element to obtain a sine signal and a cosine signal representative of the angle and/or the velocity of the rotating element to which the resolver sensor is coupled. Accurate (within acceptable tolerances given an application of resolver sensor) and timely (within time delay tolerances) derivation of the angle and/or the velocity from the sine signal and cosine signal may enable the microcontroller to control operation of the rotating element more accurately.

While the microcontroller may provide dedicated hardware to implement aspects of the RDC, often the microcontroller may execute software processes to resolve the approximate angle of the rotating element based on the digital cosine signal and digital sine signal. The microcontroller may however lack sufficient memory and/or processing capacity to implement complex software processes that involve machine learning and/or artificial intelligence. Instead, the microcontroller may implement various algorithms, such as a tracking algorithm, including a Luenberger-Observer algorithm, with respect to the digital cosine signal and the digital sine signal to obtain the estimated angle of the rotating element.

However, such tracking algorithms may require additional time to properly resolve the approximate angle of the rotating element in case of a rapid frequency change in the resolver signals e.g. due to speed change of the rotating element.

SUMMARY

In general, techniques are described for a machine learning enhanced resolver system. Rather than resort to tracking algorithms that experience delay when attempting to resolve the approximate angle for the rotating element in the context of speed change and cannot cope with noise frequency spectrum in the pass band of the filters, the microcontroller may utilize a number of different processes, implemented in both hardware and software, to enable the microcontroller to perform machine learning enhancements with respect to determining the approximate angle of the rotating element. The microcontroller may include a hardware delta-sigma analog to digital converter (DSADC) that interfaces with the resolver sensor to obtain modulated cosine and sine signals, which are converted via ADC to demodulated cosine and sine signals. The microcontroller may also include hardware filters and rectifiers that process the demodulated cosine and sine signals to filter (e.g., downsample) and rectify the demodulated cosine and sine signals in order to reduce the sample rate and align the signals with an excitation signal. Reduction of the sample rate may reduce the number of potential inputs to the machine learning model, thereby reducing the complexity of the machine learning model.

The microcontroller may include a digital signal processor having the limited memory and/or processing capacity. Given the reduced complexity of the machine learning model, the digital signal processor may have sufficient memory and/or processing capacity to execute the machine learning model, which may be trained (e.g., unsupervised training) on past filtered and rectified cosine and sine signals for a given context (e.g., electrical motor driving the rotating element). In the example of an electric motor, such electrical motors may introduce a form of noise in the resolver signals output by the resolver signal that are difficult to filter and/or remove via dedicated hardware provided by the microcontroller.

Tracking algorithms, such as the Luenberger-Observer algorithm, which are commonly employed to avoid noise perturbation into system may cope with high frequency noise due to its inherent low pass filtering structure. But this kind of classical solutions cannot cope with noise inside the band of interest or heavily distorted signals. However, the trained machine learning model may remove the in-band noise and output a possibly noise free (or reduced) digital cosine signal and a possibly noise free (or reduced) digital sine signal orders of magnitude faster than tracking algorithms while also avoiding costly hardware filters and/or other logic used in hardware only implementations.

In this respect, various aspects of the techniques improve the operation of the microcontroller itself. That is, leveraging dedicated hardware for resolver systems, the microcontroller may interface with the resolver sensor and convert the resolver signals to obtain modulated cosine and sine signals by the ADC hardware. Once obtained, the microcontroller may filter (e.g., downsample) and rectify the modulated cosine and sine signals to reduce the complexity of each of the modulated cosine and sine signals such that these modulated cosine and sine signals may have a reduced complexity as inputs into a trained machine learning model. The reduction of complexity as inputs enables the digital signal processor to store and execute a reduced complexity trained machine learning model that operates more efficiently with respect to the prefiltered and rectified modulated cosine and sine signals to remove in-band noise that would otherwise distort the estimated angle utilizing tracking algorithms, such as the Luenberger-Observer algorithm commonly used to avoid more complicated mathematical operations. The trained machine learning algorithm may enable the microcontroller to more efficiently (in terms of computing resources consumed, such as processing cycles, memory, memory bus bandwidth, etc. and associated power) remove the in-band noise and determine the approximate angle of the rotating element while also reducing delay in resolving the approximate angle compared to resolver systems relying only on hardware implementations or a combination of hardware and software implementations that rely on tracking algorithms.

In one example, aspects of the techniques are directed to processing circuitry comprising: an analog-to-digital converter electrically coupled to a resolver sensor attached to a rotating element controlled by the processing circuitry, the analog-to-digital converter configured to obtain, based on electrical interactions with the resolver sensor, a noisy modulated digital cosine signal for an indirectly sensed angle of the rotating element and a noisy modulated digital sine signal for the indirectly sensed angle of the rotating element; one or more filters configured to process the noisy modulated digital cosine signal and the noisy modulated digital sine signal to output a filtered modulated digital cosine signal and a filtered noisy modulated digital sine signal; one or more rectifiers configured to process the filtered noisy modulated digital cosine signal and the filtered noisy modulated digital sine signal to output a rectified noisy modulated digital cosine signal and a rectified noisy modulated digital sine signal; and a digital signal processor configured to: execute a first trained machine learning model that processes the rectified noisy modulated digital cosine signal and the rectified noisy modulated digital sign signal to obtain a demodulated digital cosine signal and a demodulated digital sign signal; and compute, based on the demodulated digital cosine signal and the demodulated digital sine signal, an approximate angle of the rotating element.

In another example, aspects of the techniques are directed to a method comprising: obtaining, by a delta-sigma analog-to-digital converter of a microcontroller, and based on electrical interactions with a resolver sensor, a noisy demodulated digital cosine signal for an indirectly sensed angle of the rotating element and a noisy demodulated digital sine signal for the indirectly sensed angle of the rotating element; processing, by one or more filters of the microcontroller, the noisy modulated digital cosine signal and the noisy modulated digital sine signal to output a filtered noisy demodulated digital cosine signal and a filtered noisy demodulated digital sine signal; processing, by one or more rectifiers of the microcontroller, the filtered noisy modulated digital cosine signal and the filtered noisy modulated digital sine signal to output a rectified noisy modulated digital cosine signal and a rectified noisy modulated digital sine signal; executing, by a digital signal processor of the microcontroller, a first trained machine learning model that processes the rectified noisy modulated digital cosine signal and the rectified noisy modulated digital sign signal to obtain a demodulated digital cosine signal and a demodulated digital sign signal; and computing, by the digital signal processor, and based on the demodulated digital cosine signal and the demodulated digital sine signal, an approximate angle of the rotating element.

In another example, aspects of the techniques are directed to a system comprising: a rotating element; a resolver sensor attached to the rotating element; and a microcontroller communicatively coupled to the resolver sensor and configured to control the rotating element, the microcontroller comprising: a delta-sigma analog-to-digital converter electrically coupled to the resolver sensor, the delta-sigma analog-to-digital converter configured to obtain, based on electrical interactions with the resolver sensor, a noisy modulated digital cosine signal for an indirectly sensed angle of the rotating element and a noisy modulated digital sine signal for the indirectly sensed angle of the rotating element; one or more filters configured to process the noisy modulated digital cosine signal and the noisy modulated digital sine signal to output a filtered noisy modulated digital cosine signal and a filtered noisy modulated digital sine signal; one or more rectifiers configured to process the filtered noisy modulated digital cosine signal and the filtered noisy modulated digital sine signal to output a rectified noisy modulated digital cosine signal and a rectified noisy modulated digital sine signal; and a digital signal processor configured to: execute a first trained machine learning model that processes the rectified noisy modulated digital cosine signal and the rectified noisy modulated digital sign signal to obtain a demodulated digital cosine signal and a demodulated digital sign signal; and compute, based on the demodulated digital cosine signal and the demodulated digital sine signal, an approximate angle of the rotating element.

The details of one or more aspects of the techniques are set forth in the accompanying drawings and the description below. Other features, objects, and advantages of these techniques will be apparent from the description and drawings, and from the claims.

BRIEF DESCRIPTION OF DRAWINGS

FIG. 4 is a flowchart illustrating example operation of microcontroller shown in the example of FIGS. 1A and 1B in performing the machine learning enhanced resolver techniques described in this disclosure.

DETAILED DESCRIPTION

Figure 1A:
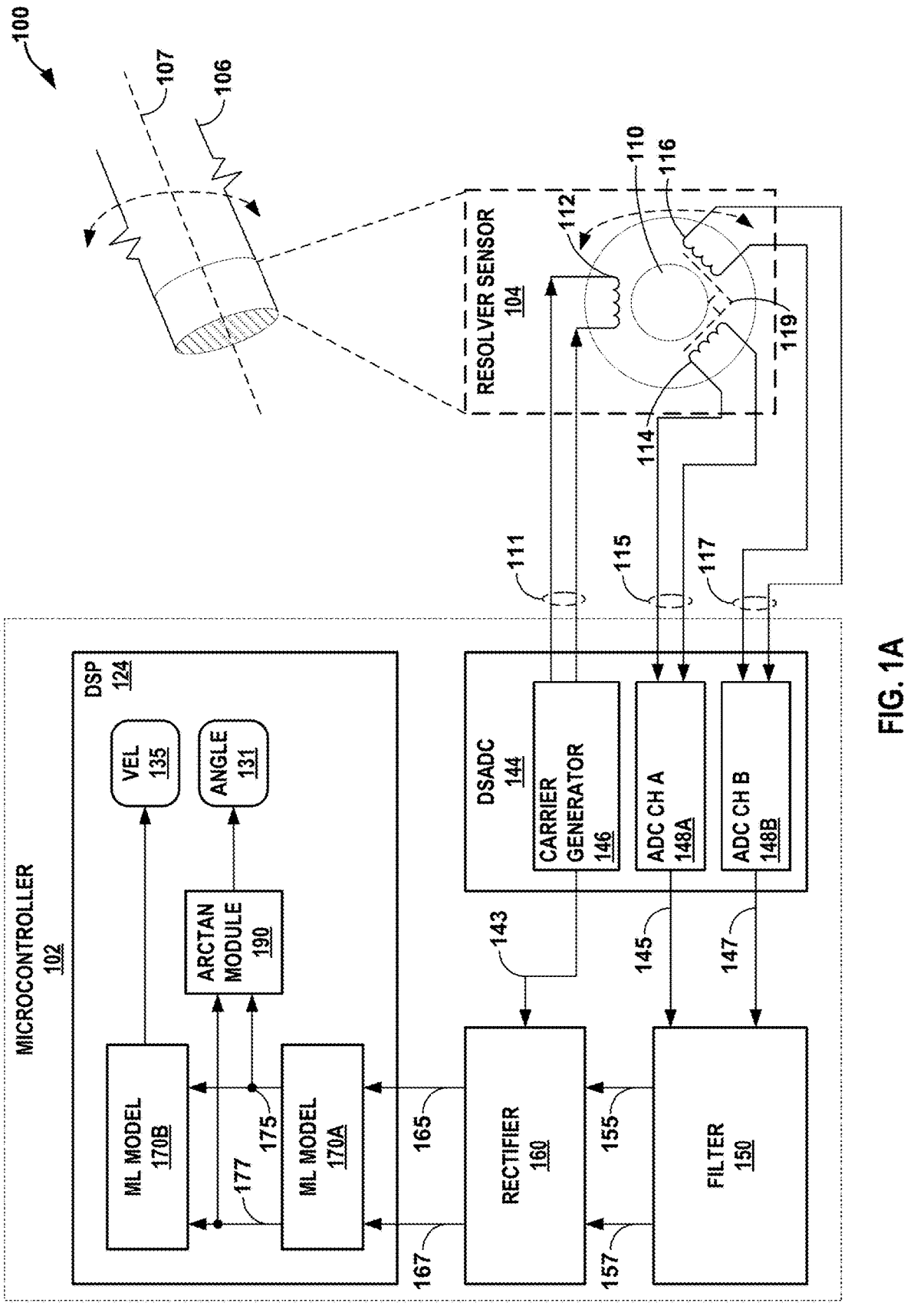
FIGS. 1A and 1B are diagrams illustrating an example system configured to perform various aspects of the machine learning enhanced resolver-to-digital converter (RDC) techniques described in this disclosure.
Figure 1B:
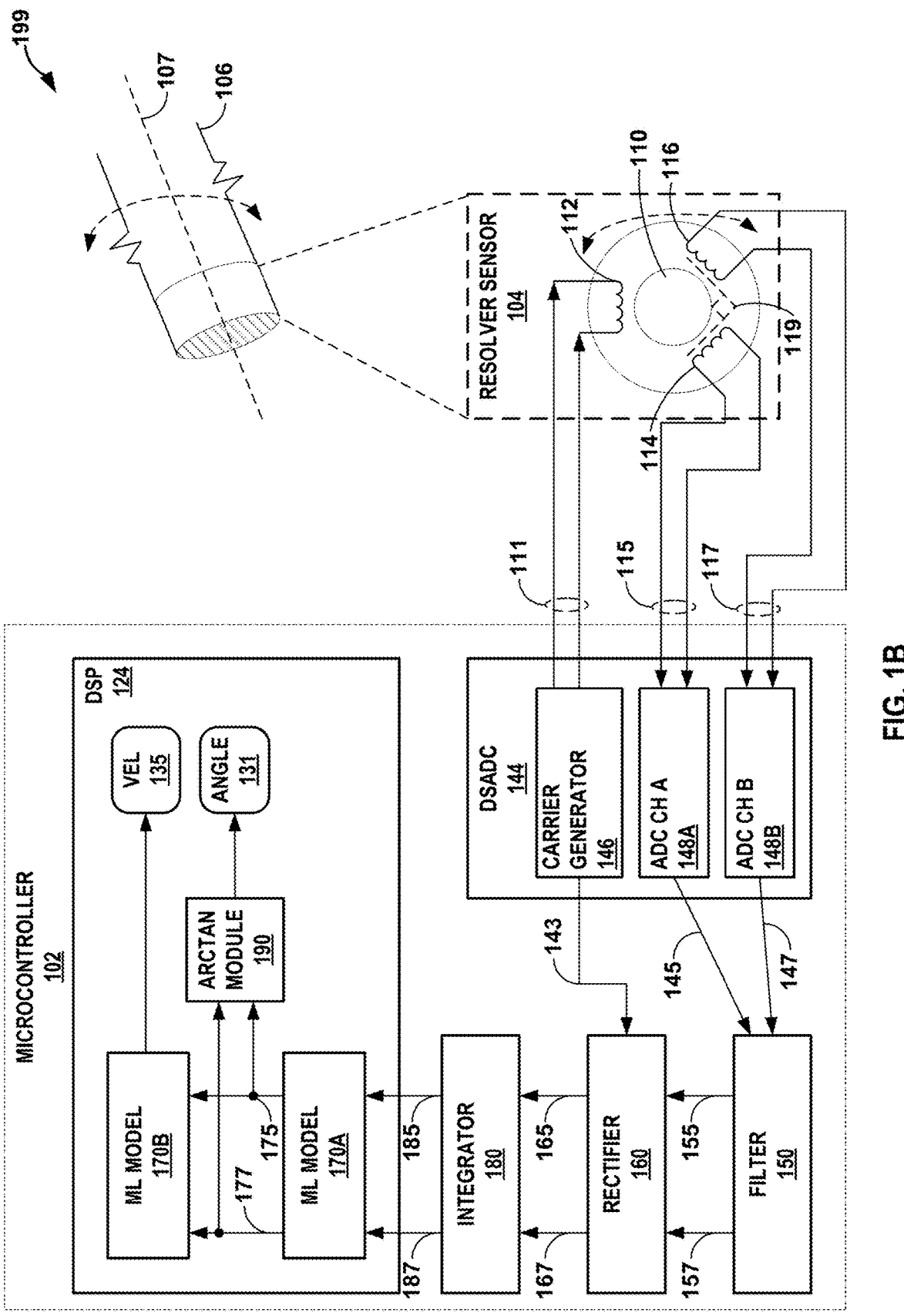

FIGS. 1A and 1B are diagrams illustrating an example system configured to perform various aspects of the machine learning enhanced resolver-to-digital converter (RDC) techniques described in this disclosure. In the example of FIG. 1A, a system 100 includes a microcontroller 102, a resolver sensor 104, and a rotating element 106 to which resolver sensor 104 is attached or otherwise mechanically affixed.

Microcontroller 102 may represent one example of processing circuitry configured to control system 100. While described with respect to microcontroller 102, various aspects of the techniques may be implemented by other types of processing circuitry, including a central processing unit (CPU), a multi-core processing unit (where each core of multiple cores forming the multi-core processing unit may represent a portion of a CPU, which may share on-chip memory, and other resources formed as part of a package, such as a system on a chip—SoC), a system on a chip (SoC), a graphics processing unit (GPU), an application specific integrated circuit (ASIC), a field programmable gate array (FPGA), a digital signal processor (DSP), and the like.

Resolver sensor 104 may represent a sensor configured to indirectly sense rotational (or angular) movement. Resolver sensor 104 is, in the example of FIG. 1, attached or otherwise mechanically affixed to rotating element 106. Rotating element 106 may represent any type of element configured to rotate or otherwise spin about a central axis 107. Rotation is denoted by a dashed arrow, where in the example of FIG. 1, rotating element 106 is shown as rotating clockwise or counterclockwise about center axis 107. Rotating element 106 may represent an axel, a shaft (such as a shaft of one of an electric motor, a servo, and the like), or any other rotating element configured to rotate around a center axis 107. Resolver sensor 104 may represent one or more of a brushless resolver sensor, a slab resolver sensor, a pancake resolver sensor, a receiver resolver sensor, a differential resolver sensor, and the like.

Resolver sensor 104 may include a rotor 110, an excitation stator 112, a sine stator 114, and a cosine stator 116 displaced approximately 90 degrees (as denoted by dashed lines 119, where such displacement is approximately 90 degrees within manufacturing tolerances) from sine stator 114. Resolver sensor 104 may resemble an electrical motor, except that excitation stator 112 does not induce an electrical current in rotor 110 to produce work (e.g., in the form of rotating rotor 110 about center axis 107) but to induce an electrical current in rotor 110 capable of being indirectly sensed by sine stator 114 and/or cosine stator 116. That is, excitation stator 112 may generate, via an analog excitation signal 111 produced by microcontroller 102, an electromagnetic field that induces a current in rotor 110. The current in rotor 110 may produce an electromagnetic field that induces a current in one or more of sine stator 114 and/or cosine stator 116.

Analog excitation signal 111 produced by microcontroller 102 and provided to excitation stator 112 may conform to a sine wave (or a cosine wave) or may conform to a pulse-width-modulated sine wave (or cosine wave), which may induce, via rotor 110, sine stator 114 to generate an analog sine signal 115 and cosine stator 116 to generate an analog cosine signal 117. Analog sine signal 115 may be out of phase by 90 degrees relative to analog cosine signal 117, which may allow microcontroller 102 to derive a current (although processing delay may be present and "current" may refer to a current position upon completion of processing analog sine signal 115 and analog cosine signal 117) angle and possibly velocity for resolver sensor 104 (which is, due to the mechanical attachment, such as a screw, a clamp, a bolt, or other removable fixture to rotating element 107 that is undergoing rotational movement). Although described with respect to a removable fixture, resolver sensor 104 may be permanently or semi-permanently attached to rotating element 106, such as by way of welding, adhesive, or the like, or some combination of removable and semi-permanent attachment to rotating element 106.

System 100 may be deployed in many different contexts to determine a current angle (or, in other words, angular position) of rotating element 106 about central axis 107, possibly a speed (or, in other words, angular velocity) of the rotating element 106 about central axis 107. System 100 may facilitate control of rotating element 106 in a larger control system in which the current angle or angular velocity may provide feedback for subsequent control of rotating element 106 (which may be attached to an electric motor, a traditional gas or fuel powered engine, servo, and the like, as well as computed in an electronic control unit (ECU) or other processing units). System 100 may, for example, be deployed within a vehicle (such as an automobile, motorcycle, bicycle including electric bicycles, farm equipment, military equipment, airplanes, aquatic vehicles, and the like), factories or other manufacturing centers, robotics, or any other context in which an angle and/or velocity of a rotating element 106 is required for monitoring or subsequent control of rotating element 106. In the automotive context, microcontroller 102 may, as one example, be integrated within an electronic control unit (ECU) or other type of control unit that observes an angular position or an angular velocity of an electric motor configured to drive an axel of a vehicle (e.g., an automobile) and thereby generate work in the form of rotating wheels for forward and/or backward movement.

As noted above, microcontroller 102 may include hardware to implement resolver-to-digital converter (RDC), which may refer to signal processing for resolving an angle 131 and/or a velocity 135 of rotating element 106. The RDCs may interface with resolver sensor 104 coupled to rotating element 106 to obtain a digital sine signal 145 and a digital cosine signal 147 representative of angle 131 and/or velocity 135 of rotating element 106 to which resolver sensor 104 is coupled. Accurate (within acceptable tolerances given an application of resolver sensor 104) and timely (within time delay tolerances) derivation of angle 131 and/or velocity 135 from digital sine signal 145 and digital cosine signal 147 may enable microcontroller 102 to control operation of rotating element 106 more accurately.

While microcontroller 102 may provide dedicated hardware to implement aspects of the RDC, often microcontroller 102 may execute software processes to resolve approximate angle 131 of rotating element 106 based on digital cosine signal 147 and digital sine signal 145. Microcontroller 102 may, however, lack sufficient memory and/or processing capacity to implement complex software processes that involve machine learning and/or artificial intelligence. Instead, microcontroller 102 may implement various algorithms, such as a tracking algorithm, including a Luenberger-Observer algorithm, with respect to digital cosine signal 147 and digital sine signal 145 to obtain approximate angle 131 of rotating element 106. However, such tracking algorithms may require additional time to properly resolve approximate angle 131 of rotating element 106 due to noise that is injected into the resolver signals in some instances.

That is, an electric motor (not shown in the example of FIG. 1A) may interface with rotating element 106 to perform work (e.g., drive rotating element 106 rotationally), where the electric motor may not be properly shielded or otherwise operate noisily by injecting electric noise into resolver sensor 104. This injected noise is "in band" in the sense that the noise is in the same frequency band as the frequency of the resolver signals (e.g., analog sine signal 115 and/or analog cosine signal 117). This noise is difficult to filter because filtering of in band noise requires a matching filter that is able to distinguish between the subtle differences in frequency between the in band noise and the resolver signals. Given that the in band noise is difficult to filter, the tracking algorithms may not properly resolve approximate angle 131 until after a delayed settling time in which the tracking algorithm slowly (relative to hardware only implementations) resolves approximate angle 131 (e.g., on the order of milliseconds rather than microsecond as would be the case with a hardware only implementation). While a hardware only implementation may resolve approximate angle 131 more quickly, configuring the hardware with matching filters for removing in band noise is a costly and complicated process.

To avoid both tracking algorithms and complicated hardware, some implementations have turned to machine learning in an attempt to utilize a trained machine learning model to act as a configurable filter that is capable of removing the in-band noise. Yet, the trained machine learning models are computationally complex and require a significant amount of memory and processing capacity that favors a dedicated CPU or other machine learning or artificial intelligence optimized processor. In other words, the inputs to the trained machine learning models optimized for RDCs signals are often numerous given that the resolver signals move between negative one (−1) and one (1) and are cyclic, sampled at a high frequency, and require significant pre-processing (in terms of filtering, ADC, etc.). The numerous inputs may increase the number of nodes of the machine learning model, which increases the size and stages (which may also be referred to as "layers") of the machine learning model.

Microcontroller 102 may have insufficient memory and/or processing capacity to store and/or execute such trained machine learning models. Often, vehicles and other computing systems may employ microcontroller 102 as a low-cost computing system to avoid incorporating more processor and/or memory intense dedicated hardware, such as CPUs, GPUs, ASICs, and/or FGPAs that are monetarily expensive and/or difficult to upgrade and/or manage. Given the complexity of trained machine learning models, microcontrollers, such as microcontroller 102, lacked the computing resources necessary to implement trained machine learning models, thereby leaving microcontroller 102 to execute tracking algorithms or other approximation algorithms that attempt to emulate and/or track angle 131 albeit with significant delay in resolving approximate angle 131 of rotating element 106 that results in imprecise control of rotating element 106.

In accordance with various aspects of the techniques described in this disclosure, microcontroller 102 may include a digital signal processor (DSP) 124 configured to execute trained machine learning model 170A. Rather than resort to tracking algorithms that experience delay when attempting to resolve approximate angle 131 for rotating element 106 in the context of noise, microcontroller 102 may utilize a number of different processes, implemented in both hardware and software, to enable microcontroller 102 to perform machine learning enhancements with respect to determining approximate angle 131 of rotating element 106. Microcontroller 102 may include a hardware delta-sigma analog to digital converter (DSADC) 144 that interfaces with resolver sensor 104 to obtain modulated cosine signals 117 and modulated sine signals 115, which are converted via ADCs 148A and 148B to modulated cosine signals 147 and modulated sine signals 145. Microcontroller 102 may also include hardware filters 150 and rectifiers 160 that process modulated cosine signals 147 and modulated sine signals 145 to filter (e.g., downsample) and rectify modulated cosine signals 147 and modulated sine signals 145 to reduce the sample rate and align signals 145/147 with excitation signal 111/143 to improve detection of angle 131. Reduction of the sample rate may reduce the number of potential inputs to machine learning (ML) model 170A, thereby reducing the complexity of ML model 170A.

Microcontroller 102 may include a digital signal processor (DSP) 124 having the limited memory and/or processing capacity. Given the reduced complexity of machine learning model 170A, DSP 124 may have sufficient memory and/or processing capacity to execute machine learning model 170A, which may be trained (e.g., via unsupervised training) on past filtered and rectified cosine and sine signals 147/145 for a given context (e.g., electrical motor driving rotating element 106). In the example of an electric motor, such electrical motors may introduce a form of in band noise in resolver signals 115/117 output by resolver sensor 104 that are difficult to filter and/or remove via dedicated hardware provided by microcontroller 102.

Tracking algorithms, such as the Luenberger-Observer algorithm, which are commonly employed to avoid dedicated hardware logic, may struggle to resolve approximate angle 131 of rotating element 106 due to the injection of this in band noise and have much longer settling time if the rotation speed changes. However, trained machine learning model 170A may remove the in band noise and output a possibly noise free (or reduced) digital cosine signal 177 and a possibly noise free (or reduced) digital sine signal 175 orders of magnitude faster than tracking algorithms (with very short settling time) while also avoiding costly hardware filters and/or other logic used in hardware only implementations.

In operation, DSADC 144 is electrically coupled to resolver sensor 104 attached to rotating element 106 controlled by microcontroller 102 or other processing circuitry. DSADC 144 may include a carrier generator 146 that outputs excitation signal 111 to excitation stator 112 of resolver sensor 104. Excitation signal 111 may induce a current in sine stator 114 and/or cosine stator 116, which produces analog sine signals 115 and analog cosine signals 117. DSADC 144 may include ADCs 148A and 148B that convert analog sine signals 115 and analog cosine signals 117 into a noisy modulated digital sine signal 145 and a noisy modulated digital cosine signal 147 for the indirectly senses angle of rotating element 106.

Microcontroller 102 also includes one or more filters 150 configured to process noisy modulated digital cosine signal 147 and noisy modulated digital sine signal 145 to output a filtered noisy modulated digital cosine signal 157 and a filtered noisy modulated digital sine signal 155. Filter 150 may, as one example, represent a cyclic integrating comb (CIC) filter (which may also be referred to as a cascade integrating comb—CIC—filter). CIC filter 150 (which is another way to refer to filter 150) may downsample noisy modulated digital cosine signal 147 and noisy modulated sine signal 145 to obtain downsampled noisy modulated digital cosine signal and downsampled noisy modulated sine signal as filtered modulated cosine and sine signals 157/155.

CIC filter 150 may represent a computationally efficient class of low-pass finite impulse response (FIR) filter that chains N number of integrator and comb filter pairs (where N is the filter's order) to form a decimator. For the decimating CIC filter, the input signal (e.g., noisy modulated sine and cosine signals 145/147) is first fed through N integrator stages, followed by a down-sample, and then N comb stages. The integrator-comb filter performs a simple moving average, but omits the division by the total number of filtered samples. CIC filter 150 may effectively down-sample the signal to reduce a number of inputs to ML model 170A. In any event, CIC filter 150 may output filtered noisy modulated sine and cosine signals 155/157 to rectifier 160.

Rectifier 160 may represent one or more rectifiers that are configured to process filtered noisy modulated digital cosine signal 157 and filtered noisy modulated digital sine signal 155 to output a rectified noisy modulated digital cosine signal 167 and a rectified noisy modulated digital sine signal 165. Rectifier 160 may effectively align filtered noisy modulated digital sine and cosine signals 155/157 with excitation signal 143 to facilitate detection of angle 131 of rotating element 106. Rectifier 160 may receive excitation signal 143 from carrier generator 146, which is a representation of excitation signal 111 used to induce the current in excitation stator 112 of resolver sensor 104. Rectifier 160 may process filtered noisy modulated digital sine and cosine signals 155/157 based on excitation signal 143 to output rectified noisy modulated digital sine and cosine signals 165/167 to ML model 170A.

DSP 124 may next execute trained machine learning model 170A that processes rectified noisy modulated digital cosine signal 167 and rectified noisy modulated digital sine signal 165 to obtain a demodulated digital cosine signal 177 and a demodulated digital sine signal 175. Trained machine learning model 170A may represent any type of machine learning model, such as an autoencoder or a transformer. An autoencoder is a type of artificial neural network used to learn efficient coding of unlabeled data (which is used in a type of machine learning training referred to as unsupervised training in that the training is not supervised by a designer of the model and the autoencoder learns in an unsupervised manner to maximize a reward).

The autoencoder may learn two functions in the form of an encoding function that transforms the input data and a decoding function that recreates the input data from the encoded representation. The autoencoder may learn an efficient representation (encoding) for a set of data, typically for dimensionality reduction. In this instance, the autoencoder may encode rectified noisy modulated digital sine and cosine signals 165/167 to obtain codes and then decode the codes to obtain a representation of rectified noisy modulated digital sine and cosine signals 165/167 that possibly excludes the in band noise and rectification imperfections, thereby outputting demodulated digital sine and cosine signals 175/177.

Machine learning model 170A may output demodulated digital sine and cosine signals 175/177 to a second machine learning model 170B as well as to an arctan model 190. Machine learning model 170B may represent a trained machine learning model that is trained to determine velocity 135 of rotating element 106 based on demodulated digital sine and cosine signals 175/177. Trained machine learning model 170B may represent any type of machine learning model capable of being trained via unsupervised learning, such as a multi-layer perceptron or any other type of feedforward artificial neural network. A multi-layer perceptron may include fully connected neurons with a nonlinear kind of activation function, where the neurons are organized in at least three layers. The multi-layer perceptron may be trained using backpropagation, which is a form of gradient estimation that computes the gradient of a loss function with respect to the weights of the artificial neural network.

DSP 124 may invoke ArcTan module 190 to compute the arctangent of demodulated digital cosine signal 177 and demodulated digital sine signal 175 to obtain approximate angle 131 of rotating element 106. DSP 124 may output angle 131 and velocity 135 to another system and/or algorithm that controls the electric motor or other element driving rotating element 106.

In this respect, various aspects of the techniques improve the operation of microcontroller 102 itself. That is, leveraging dedicated hardware for resolver systems, microcontroller 102 may interface with resolver sensor 106 and demodulate resolver signals 115/117 to obtain demodulated cosine and sine signals 177/175. Once obtained, microcontroller 102 may filter (downsample) and rectify modulated cosine and sine signals 147/145 to reduce the complexity and improve detection of each of modulated cosine and sine signals 165/167 such that these modulated cosine and sine signals 167/165 may have a reduced complexity as inputs into trained machine learning model 170A.

The reduction of complexity as inputs enables digital signal processor 124 to store and execute a reduced complexity trained machine learning model 170A that operates more efficiently with respect to modulated cosine and sine signals 167/165 to remove in band noise and significantly reduce settling time delay in resolver systems utilizing tracking algorithms, such as the Luenberger-Observer algorithm commonly used. Trained machine learning model 170A may enable microcontroller 102 to more efficiently (in terms of computing resources consumed, such as processing cycles, memory, memory bus bandwidth, etc. and associated power) remove the in-band noise and determine approximate angle 131 of rotating element 106 while also reducing delay in resolving approximate angle 131 compared to resolver systems relying only on hardware implementations or a combination of hardware and software implementations involving tracking algorithms.

In the example of FIG. 1B, resolver system 199 is similar to resolver system 100 shown in the example of FIG. 1A, microcontroller 102 also includes an integrator 180 that processes rectified noisy modulated digital sine and cosine signals 165/167 to produce integrated noisy (partly or fully) demodulated digital sine and cosine signals 185/187. Integrator 180 may output integrated noisy demodulated digital sine and cosine signals 185/187 to ML model 170A, which is trained to process integrated noisy demodulated digital sine and cosine signals 185/187 to obtain demodulated sine and cosine signals 175/177 in a manner similar to that described above. However, as shown in the example of FIG. 1A, trained machine learning model 170A may operate with respect to non-integrated rectified noisy demodulate digital sine and cosine signals 165/167, which may more efficiently (due to the lack of integration performed by integrator 180) determine demodulated digital sine and cosine signals 175/177.

Figure 2A:
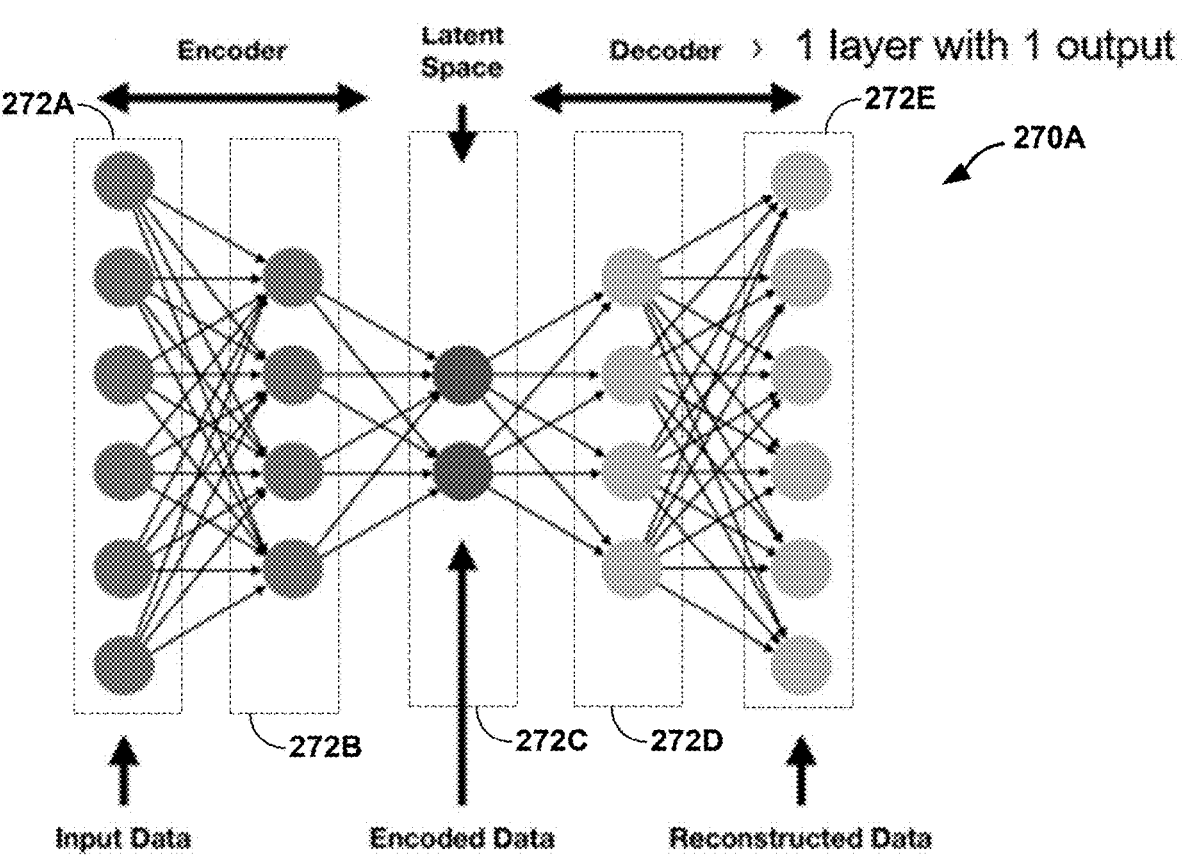
FIGS. 2A and 2B are diagrams illustrating examples of the trained machine learning models shown in the examples of FIGS. 1A and 1B in performing filtering and rectification correction along with velocity estimation in accordance with various aspects of the machine learning enhanced resolver techniques described in this disclosure.
Figure 2B:
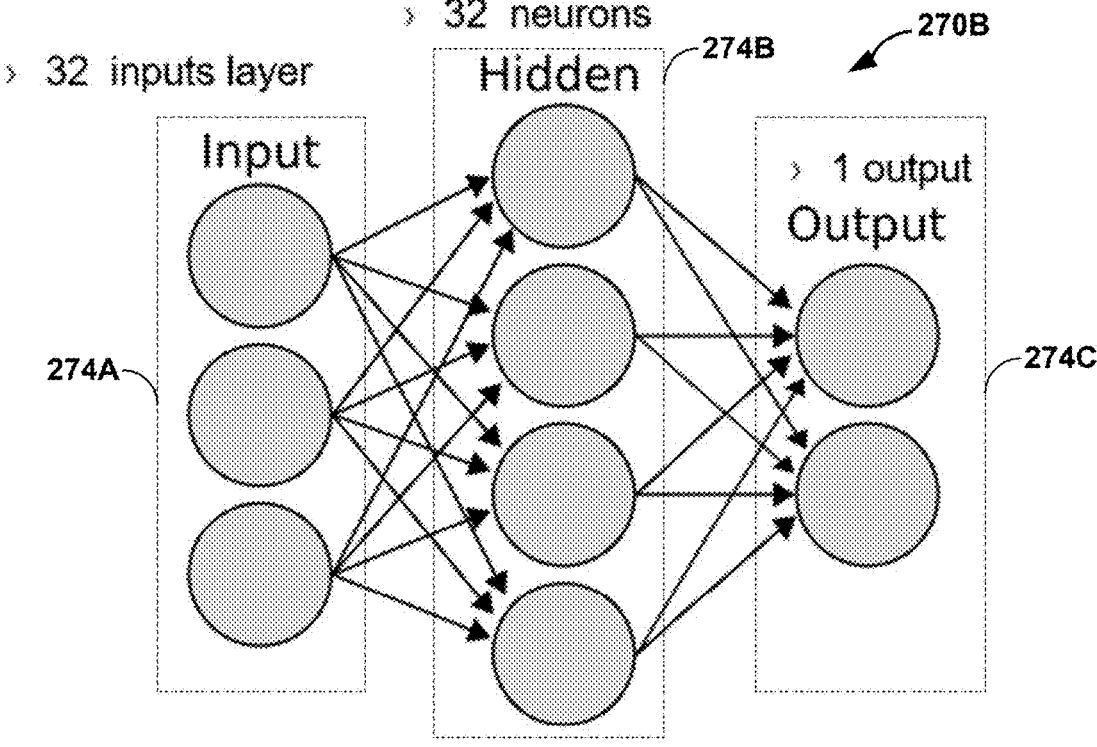

FIGS. 2A and 2B are diagrams illustrating examples of the trained machine learning models shown in the examples of FIGS. 1A and 1B in performing filtering and rectification correction along with velocity estimation in accordance with various aspects of the machine learning enhanced resolver techniques described in this disclosure. In the example of FIG. 2A, a trained machine learning model 270A is shown that represents an example of trained machine learning model 170A. Trained machine learning model 270A includes two stages 272A and 272B comprised of nodes (shown as circles) interconnected (e.g., in this example fully interconnected) with other nodes.

First input stage 272A includes nodes (e.g., 32 nodes) that receive input data in the form of rectified noisy demodulated digital sine and cosine signals 165/167, where each of the nodes of first input stage 272A are fully interconnected with nodes included in second input stage 272B. "Fully interconnected" refers to the neural network architecture in which each node of first input stage 272A includes an edge (e.g., in the form of a pointer or other computer reference) to each node of second input stage 272B. Each node of first and second input stages 272A and 272B includes a weight, which each node applies to input data 165/167 (which is another way of referring to rectified noisy demodulated digital sine and cosine signals 165/167) prior to forwarding the weighted input signals to the next stage of autoencoder 270A (which is another way of referring to trained machine learning model 270A).

In this example, trained machine learning model 270A is shown as an autoencoder, which as noted above is a form of an artificial neural network having neurons disposed across first and second encoder stages 272A and 272B that encode input data 165/167. A third stage 272C may represent a latent space, which is defined as the code space in which input data is encoded as "encoded data" comprised of codes. Latent space 272C may include 16 neurons. Autoencoder 270A further includes a fourth and fifth stage 272D and 272E that each comprise nodes that are fully interconnected, meaning that the nodes of fourth stage 272D are fully interconnected with the nodes of fifth stage 272E. Forth and fifth stages 272D and 272E decode the encoded data in an effort to reproduce input data 166/167. Effectively, trained machine learning model 270A may operate as a kind of median filter.

In the example of FIG. 2B, machine learning model 270B may represent an example of machine learning model 170B, which is trained to predict velocity 135 of rotating element 106 based on demodulated sine and cosine signals 175/177 (which may also be referred to as input data 175/177). Machine learning model 270B may represent a multi-layer perceptron trained using backpropagation. Machine learning model 270B may include a first stage 274A, a second stage 274B, and a third stage 274C. The nodes of first stage 274A may be fully interconnected to the nodes of second stage 274B, while the nodes of second stage 274B may be fully interconnected with the nodes of third stage 274C. Each node may be trained with a weight that is applied to input data 175/177 before being passed to the next stage, where machine learning model 270B may output velocity 135 as output data. Effectively, machine learning model 270B may perform a Taylor series approximating a non-linear function.

Figure 3A:
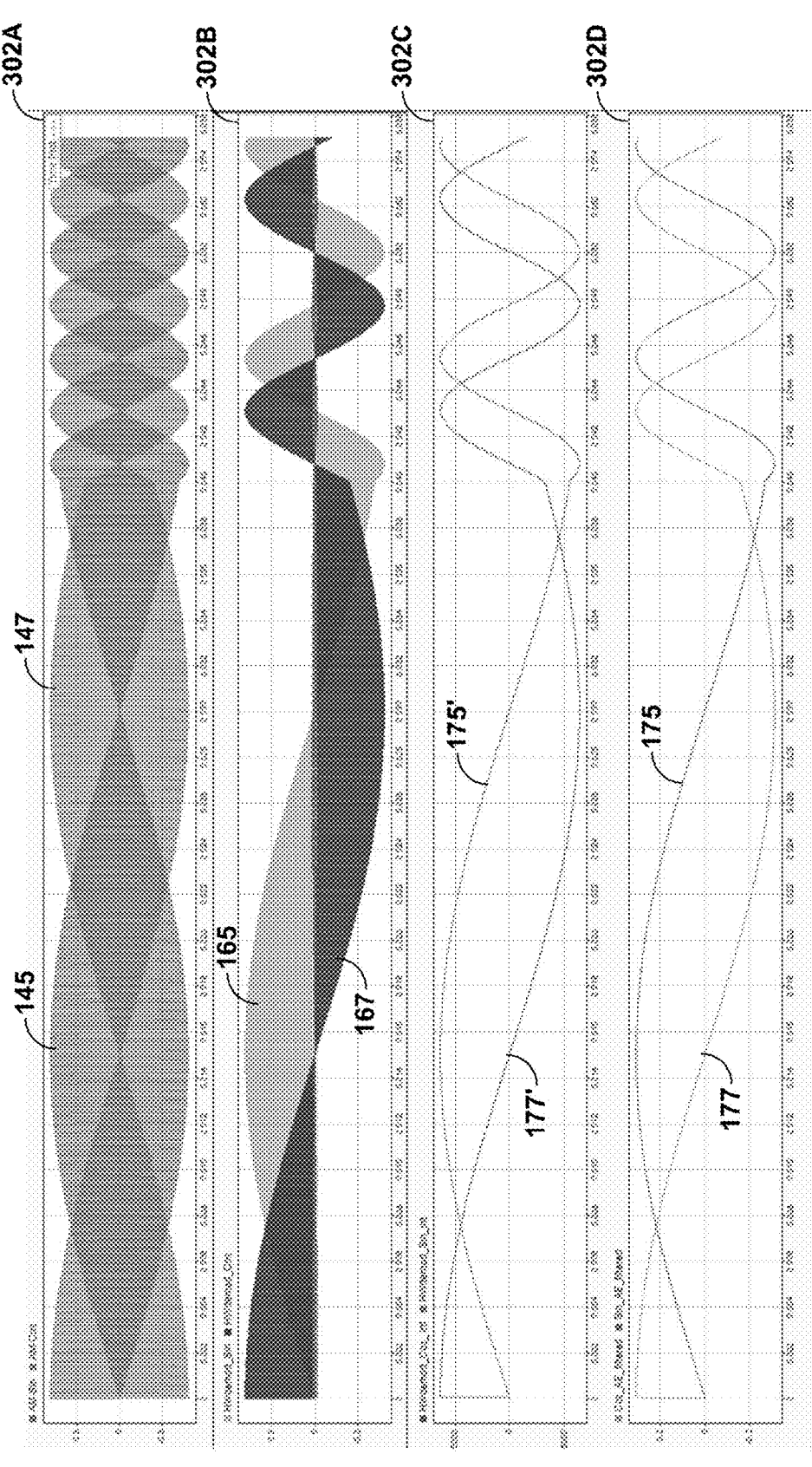
FIGS. 3A-3C are diagrams illustrating a series of graphs depicting comparisons between hardware-based resolver systems and the machine learning enhanced resolver systems operating in accordance with various aspects of the techniques described in this disclosure.
Figure 3B:
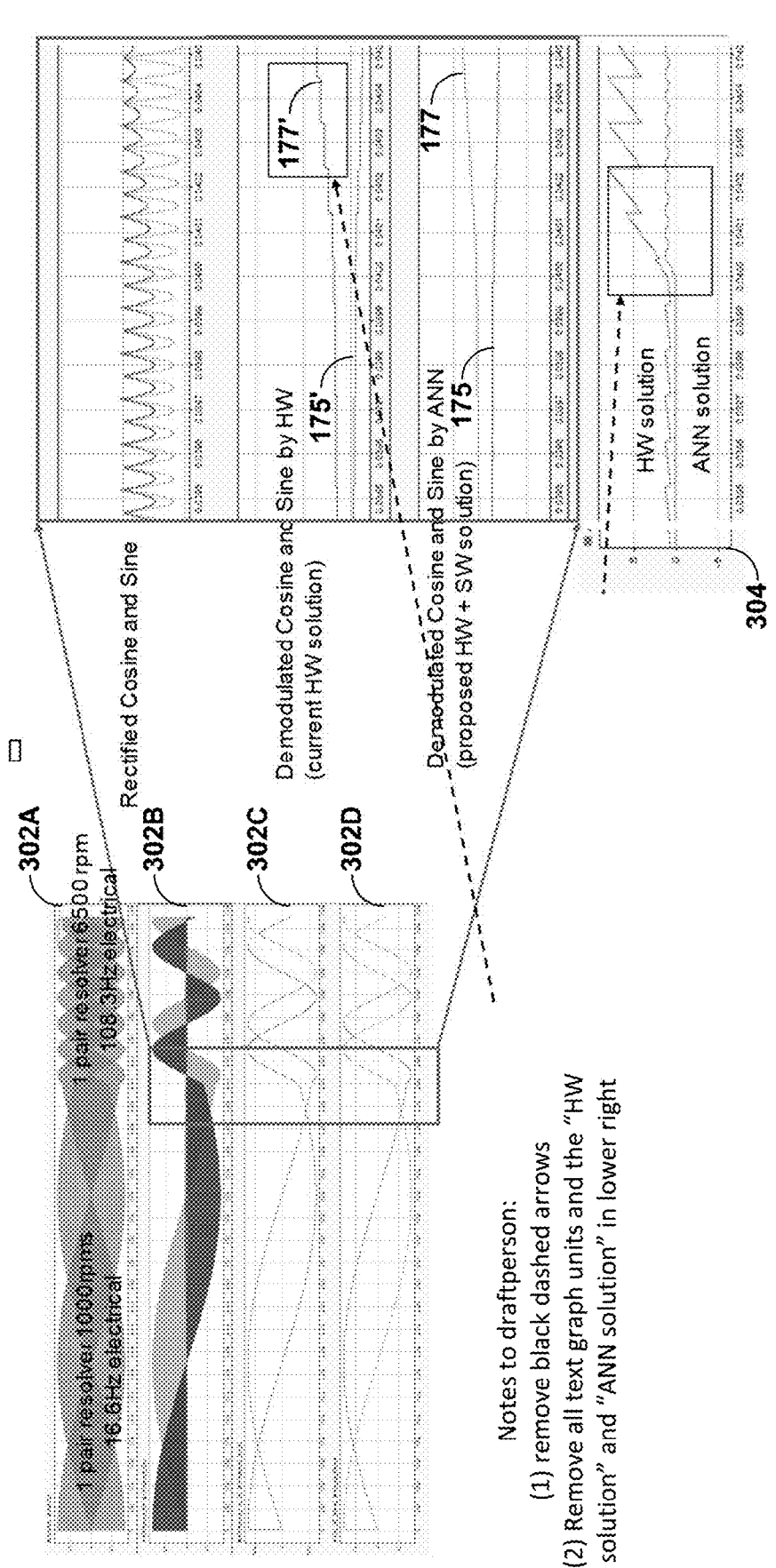
Figure 3C:
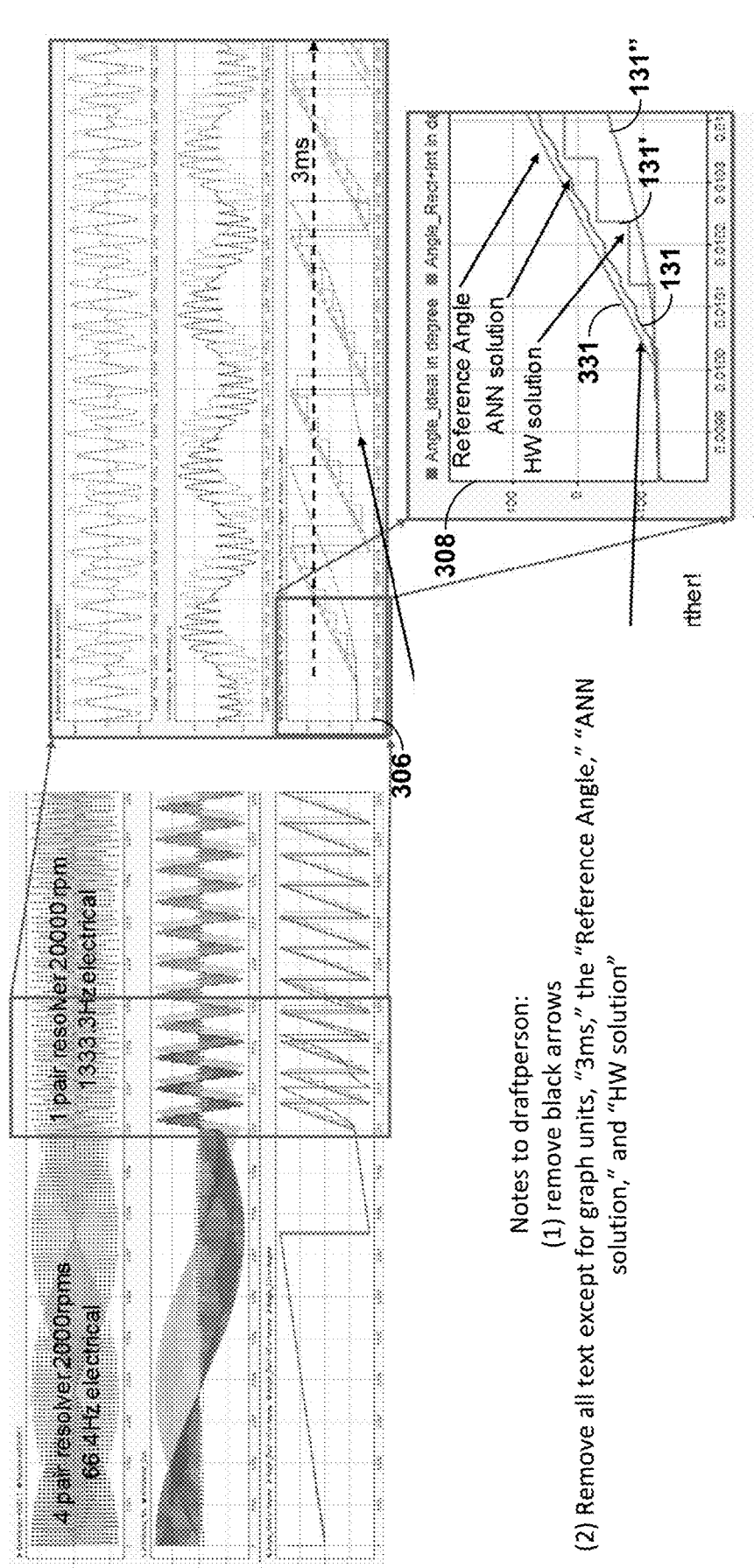

FIGS. 3A-3C are diagrams illustrating a series of graphs depicting comparisons between hardware-based resolver systems and the machine learning enhanced resolver systems operating in accordance with various aspects of the techniques described in this disclosure. Referring first to the example of FIG. 3A, four graphs 302A-302D are shown, where graph 302A depicts a noisy modulated digital sine signal 145 and a noisy modulated digital cosine signal 147 output by DSADC 144 shown in the example of FIG. 1. Graph 302B depicts rectified noisy modulated digital sine signal 165 and rectified noisy modulated digital cosine signal 167 output by rectifier 160.

Graph 302C depicts a demodulated digital sine signal 175' and a demodulated digital cosine signal 177' generated by a hardware-based resolver system that are then used to compute approximate angle 131 (where the prime (') notation denotes a similar but differently generated signal). In comparison, graph 302D depicts a demodulated digital sine signal 175 and a demodulated digital cosine signal 177 generated by ML model 170A shown in the example of FIGS. 1A and 1B. In comparing graph 302C to graph 302D, ML model 170A can mimic the hardware-based resolver behavior.

In the example of FIG. 3B, graphs 302A-302D from FIG. 3A are shown in the upper left and a blow up of a portion of each of graphs 302A-302D are shown on the right. In portion of graph 302C on the right, the output data rate of the HW solution is 10 kilo Hertz (kHz), which would require interpolation observer on the central processing unit (CPU) side in the hardware-based only resolver system. Such interpolation observer may inject a negative impact in terms of settling time (e.g., several milliseconds) and accuracy.

However, as shown in the portion of graph 302D on the right, ML model 170A may determine demodulated sine and cosine signals 175/177 almost instantaneously (e.g., 52 microseconds). Graph 304 in the lower right of FIG. 3B may depict angle error vs reference angle in degrees, where the hardware-based resolver experiences significant angle error while the machine learning enhanced resolver system has much lower angle error compared to the hardware-based resolver system.

In the example of FIG. 3C, a comparison of the machine-learning enhanced resolver system shown in FIG. 1A relative to a Luenberger-Observer-based hardware and software resolver system and the hardware-based only resolver system. Graph 306 shows the ideal angle 331 relative to approximate angle 131 computed by the machine learning enhanced resolver system 100 (shown as "ANN solution" in the portion of graph 306 denoted as graph 308), an approximate angle 131' computed by the hardware-based only resolver system, and an approximate angle 131" computed by the Luenberger-Observer (LO) hardware and software-based resolver system ("the LO resolver system"). The LO resolver system takes approximately 3 ms to settle, injecting significant delay while also injecting significant angle error compared to both the hardware-based only resolver system and machine learning enhanced resolver system 100. Machine learning enhanced resolver system 100 is also, as noted above, potentially better in terms of both settling time and accuracy compared to the hardware-based only resolver system.

FIG. 4 is a flowchart illustrating example operation of microcontroller shown in the example of FIGS. 1A and 1B in performing the machine learning enhanced resolver techniques described in this disclosure. As described above, microcontroller 102 may include DSADC 144, which is electrically coupled to resolver sensor 104 attached to rotating element 106 controlled by microcontroller 102 or other processing circuitry. DSADC 144 may include a carrier generator 146 that outputs excitation signal 111 to excitation stator 112 of resolver sensor 104. Excitation signal 111 may induce a current in sine stator 114 and/or cosine stator 116, which produces analog sine signals 115 and analog cosine signals 117. DSADC 144 may include ADCs 148A and 148B that convert analog sine signals 115 and analog cosine signals 117 into a noisy modulated digital sine signal 145 and a noisy modulated digital cosine signal 147 for the indirectly senses angle of rotating element 106 (350).

Microcontroller 102 also includes one or more filters 150 configured to process noisy modulated digital cosine signal 147 and noisy modulated digital sine signal 145 to output a filtered noisy modulated digital cosine signal 157 and a filtered noisy modulated digital sine signal 155 (352). Filter 150 may, as one example, represent a cyclic integrating comb (CIC) filter (which may also be referred to as a cascade integrating comb—CIC—filter). CIC filter 150 (which is another way to refer to filter 150) may downsample noisy modulated digital cosine signal 147 and noisy modulated sine signal 145 to obtain downsampled noisy modulated digital cosine signal and downsampled noisy modulated sine signal as filtered demodulated cosine and sine signals 157/155.

Rectifier 160 may represent one or more rectifiers that are configured to process filtered noisy modulated digital cosine signal 157 and filtered noisy modulated digital sine signal 155 to output a rectified noisy modulated digital cosine signal 167 and a rectified noisy modulated digital sine signal 165 (354). Rectifier 160 may effectively align filtered noisy modulated digital sine and cosine signals 155/157 with excitation signal 143 to facilitate detection of angle 131 of rotating element 106. Rectifier 160 may receive excitation signal 143 from carrier generator 146, which is a representation of excitation signal 111 used to induce the current in excitation stator 112 of resolver sensor 104. Rectifier 160 may process filtered noisy modulated digital sine and cosine signals 155/157 based on excitation signal 143 to output rectified noisy modulated digital sine and cosine signals 165/167 to ML model 170A.

DSP 124 may next execute trained machine learning model 170A that processes rectified noisy modulated digital cosine signal 167 and rectified noisy modulated digital sine signal 165 to obtain a demodulated digital cosine signal 177 and a demodulated digital sine signal 175 (356). Trained machine learning model 170A may represent any type of machine learning model, such as an autoencoder or a transformer. An autoencoder is a type of artificial neural network used to learn efficient coding of unlabeled data (which is used in a type of machine learning training referred to as unsupervised training in that the training is not supervised by a designer of the model and the autoencoder learns in an unsupervised manner to maximize a reward).

Machine learning model 170A may output demodulated digital sine and cosine signals 175/177 to a second machine learning model 170B as well as to an arctan model 190. Machine learning model 170B may represent a trained machine learning model that is trained to determine velocity 135 of rotating element 106 based on demodulated digital sine and cosine signals 175/177. Trained machine learning model 170B may represent any type of machine learning model capable of being trained via unsupervised learning, such as a multi-layer perceptron or any other type of feedforward artificial neural network. A multi-layer perceptron may include fully connected neurons with a nonlinear kind of activation function, where the neurons are organized in at least three layers. The multi-layer perceptron may be trained using backpropagation, which is a form of gradient estimation that computes the gradient of a loss function with respect to the weights of the artificial neural network.

DSP 124 may invoke ArcTan module 190 to compute the arctangent of demodulated digital cosine signal 177 and demodulated digital sine signal 175 to obtain approximate angle 131 of rotating element 106 (358). DSP 124 may output angle 131 and velocity 135 to another system and/or algorithm that controls the electric motor or other element driving rotating element 106.

Figure 5:
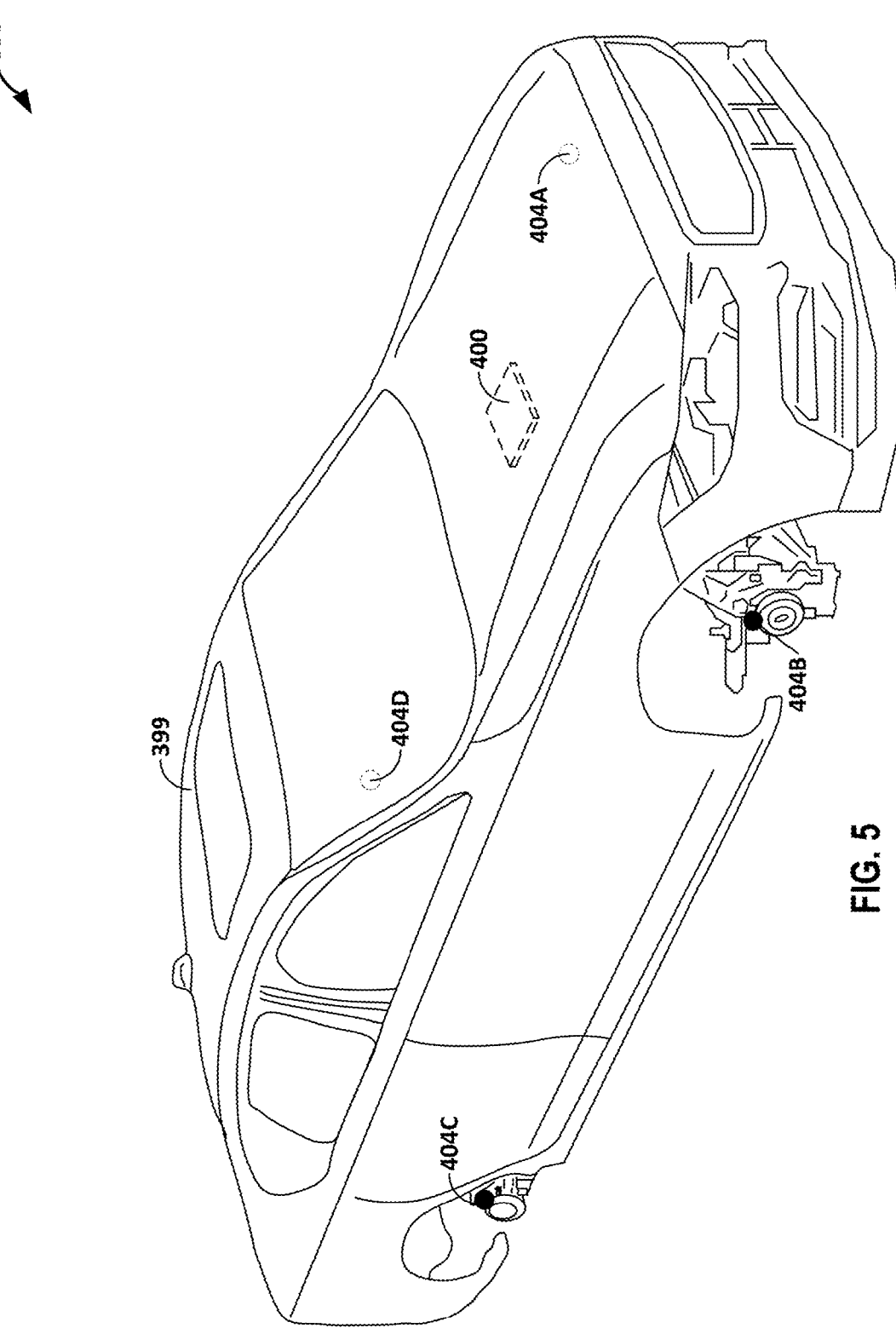
FIG. 5 is a diagram illustrating an example system configured to perform various aspects of the machine learning enhanced resolver-to-digital converter techniques described in this disclosure.

FIG. 5 is a diagram illustrating an example system configured to perform various aspects of the machine learning enhanced resolver-to-digital converter techniques described in this disclosure. Although shown as an automobile in the example of FIG. 5, vehicle 399 may represent any type of vehicle, including an automobile, a truck, farm equipment, a motorcycle, a bike (including electronic bikes), a scooter, construction equipment, a semi-truck, an airplane, a helicopter, a military vehicle, or any other type of vehicle capable of implementing various aspects of the secure external storage techniques described in this disclosure.

As further shown in the example of FIG. 5, vehicle 399 includes a computing system 400 (which may represent one example of microcontroller 102 shown in the example of FIG. 1) and a plurality of sensors 404A-404D ("sensors 404"). Computing system 400 and some of sensors 404 are shown in the example of FIG. 5 using dashed lines to denote that computing device 400 and sensors 404 may not be visible or are otherwise integrated within vehicle 399.

Computing system 400 may include one or more electronic control unit (ECUs) and a computing device. For example, computing system 400 may include an ECU configured to control an electric motor, anti-lock braking systems (ABS, which may also control traction control—TC), an ECU configured to control the Electronic Stability Control (ESC) system, and a main ECU acting as the computing device to direct operation of all of the systems (including those not listed in this example). Generally, an ECU includes a microcontroller, and memory (such as one or more of static random access memory—SRAM, electrically erasable programmable read-only memory—EEPROM, and Flash memory), digital and/or analog inputs, digital and/or analog outputs (such as relay drivers, H bridge drivers, injector drivers, and logic outputs).

In some examples, rather than utilize an ECU as the computing device, computing system 400 may include a relatively more powerful processor (compared to the microcontroller) configured to execute instructions or other forms of software to perform various aspects of the techniques described in this disclosure. The processor may represent one or more of fixed function, programmable, or combinations thereof, such as microprocessors, digital signal processors (DSPs), application specific integrated circuits (ASICs), field programmable gate arrays (FPGAs), discrete logic, software, hardware, firmware or any combinations thereof. When the techniques are implemented partially in software, computing system 400 may store instructions for the software in a suitable, non-transitory computer-readable medium and execute the instructions in hardware using one or more processors to perform the techniques of this disclosure. A device including computing system 400 may comprise an integrated circuit, and/or a microprocessor.

For purposes of illustration, computing system 400 is assumed to represent a processor communicatively coupled to one or more ECU responsible for controlling operation of the electric motor that drives axels and thereby results in movement of vehicle 399. Sensors 404A-404D may represent examples of resolver sensor 104 configured to sense wheel speed at the wheels of vehicle 399 (although the wheels are not shown so as to illustrate an approximate location of sensors 404B and 404C), and as such may be referred to as "wheel speed sensors 404."

The ECU may be communicatively coupled to the wheel speed sensors 404 and operate as described above with respect to microcontroller 102 to obtain an approximate angle of the axel to which sensors 404 are attached or otherwise affixed. The ECU may determine this angle in order to control acceleration or deceleration of rotating element 106, which in this example is assumed to be an axel. Using this angle, the ECU may control the electric motor to speed up, slow down, or maintain the current rotational speed of electric motor and thereby move vehicle 399.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carriers, signals, or other transitory media, but are instead directed to non-transitory, tangible storage media. Disk and disc, as used herein, includes compact disc (CD), laser disc, optical disc, digital versatile disc (DVD), and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable gate arrays (FPGAs), complex programmable logic devices (CPLDs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

In this respect, one or more aspects of the techniques may enable the following examples:

Example 1. Processing circuitry comprising: an analog-to-digital converter electrically coupled to a resolver sensor attached to a rotating element controlled by the processing circuitry, the analog-to-digital converter configured to obtain, based on electrical interactions with the resolver sensor, a noisy modulated digital cosine signal for an indirectly sensed angle of the rotating element and a noisy modulated digital sine signal for the indirectly sensed angle of the rotating element; one or more filters configured to process the noisy modulated digital cosine signal and the noisy modulated digital sine signal to output a filtered modulated digital cosine signal and a filtered noisy modulated digital sine signal; one or more rectifiers configured to process the filtered noisy modulated digital cosine signal and the filtered noisy modulated digital sine signal to output a rectified noisy modulated digital cosine signal and a rectified noisy modulated digital sine signal; and a digital signal processor configured to: execute a first trained machine learning model that processes the rectified noisy modulated digital cosine signal and the rectified noisy modulated digital sign signal to obtain a demodulated digital cosine signal and a demodulated digital sign signal; and compute, based on the demodulated digital cosine signal and the demodulated digital sine signal, an approximate angle of the rotating element.

Example 2. The processing circuitry of example 1, wherein the filter comprises a cyclic integrating comb filter that downsamples the noisy modulated digital cosine signal and the noisy modulated digital sine signal to output a downsampled digital cosine signal as the filtered noisy modulated digital cosine signal and a downsampled digital sine signal as the filtered noisy modulated digital cosine signal.

Example 3. The processing circuitry of any of examples 1 and 2, further comprising one or more integrators, wherein the one or more rectifiers output the rectified noisy modulated digital cosine signal and the rectified noisy modulated digital sine signal to the one or more integrators, and wherein the one or more integrators process the rectified noisy modulated digital cosine signal and the rectified noisy modulated digital sine signal to output an integrated noisy modulated or demodulated digital cosine signal and an integrated noisy modulated or demodulated digital sine signal to the digital signal processor as the rectified noisy modulated or demodulated digital cosine signal and the rectified noisy modulated or demodulated digital sine signal.

Example 4. The processing circuitry of any of examples 1-3, wherein the first trained machine learning model comprises an autoencoder neural network or a transformer.

Example 5. The processing circuitry of any of examples 1-4, wherein the digital signal processor is further configured to execute a second trained machine learning model that processes the demodulated digital cosine signal and the demodulated digital sine signal to obtain an approximate velocity of the rotating element.

Example 6. The processing circuitry of example 5, wherein second trained machine learning model comprises a multi-layer perceptron.

Example 7. The processing circuitry of any of examples 1-6, wherein the processing circuitry resolves the approximate angle of the rotating element in less than one millisecond.

Example 8. The processing circuitry of any of examples 1-7, wherein the rectified noisy demodulated digital cosine signal includes first in band noise, wherein the rectified noisy modulated digital sine signal includes second in band noise, and wherein the first trained machine learning model removes the first in band noise from the rectified noisy modulated or demodulated digital cosine signal and the second in band noise from the rectified noisy modulated or demodulated digital sign signal to obtain the demodulated digital cosine signal and the demodulated digital sign signal.

Example 9. The processing circuitry of any of examples 1-8, wherein the digital signal processor, to compute the approximate angle of the rotating element, computes an arctangent of the demodulated digital cosine signal and the demodulated digital sine signal to obtain the approximate angle of the rotating element.

Example 10. The processing circuitry of any of examples 1-9, wherein the processing circuitry comprises a microcontroller.

Example 11. A method comprising: obtaining, by a delta-sigma analog-to-digital converter of a microcontroller, and based on electrical interactions with a resolver sensor, a noisy demodulated digital cosine signal for an indirectly sensed angle of the rotating element and a noisy demodulated digital sine signal for the indirectly sensed angle of the rotating element; processing, by one or more filters of the microcontroller, the noisy modulated digital cosine signal and the noisy modulated digital sine signal to output a filtered noisy demodulated digital cosine signal and a filtered noisy demodulated digital sine signal; processing, by one or more rectifiers of the microcontroller, the filtered noisy modulated digital cosine signal and the filtered noisy modulated digital sine signal to output a rectified noisy modulated digital cosine signal and a rectified noisy modulated digital sine signal; executing, by a digital signal processor of the microcontroller, a first trained machine learning model that processes the rectified noisy modulated digital cosine signal and the rectified noisy modulated digital sign signal to obtain a demodulated digital cosine signal and a demodulated digital sign signal; and computing, by the digital signal processor, and based on the demodulated digital cosine signal and the demodulated digital sine signal, an approximate angle of the rotating element.

Example 12. The method of example 11, wherein the one or more filters comprise a cyclic integrating comb filter, and wherein processing the noisy modulated digital cosine signal and the noisy demodulated digital sine signal comprises downsampling, by the cyclic integrating comb filter, the noisy modulated digital cosine signal and the noisy modulated digital sine signal to output a downsampled digital cosine signal as the filtered noisy modulated digital cosine signal and a downsampled digital sine signal as the filtered noisy modulated digital cosine signal.

Example 13. The method of any of examples 11 and 12, further comprising processing, by one or more integrators, the rectified noisy modulated digital cosine signal and the rectified noisy modulated digital sine signal to output an integrated noisy modulated or demodulated digital cosine signal and an integrated noisy modulated or demodulated digital sine signal to the digital signal processor as the rectified noisy modulated or demodulated digital cosine signal and the rectified noisy modulated or demodulated digital sine signal.

Example 14. The method of any of examples 11-13, wherein the first trained machine learning model comprises an autoencoder neural network or a transformer.

Example 15. The method of any of examples 11-14, further comprising executing a second trained machine learning model that processes the demodulated digital cosine signal and the demodulated digital sine signal to obtain an approximate velocity of the rotating element.

Example 16. The method of example 15, wherein second trained machine learning model comprises a multi-layer perceptron.

Example 17. The method of any of examples 11-16, wherein resolving the approximate angle comprises resolving the approximate angle of the rotating element in less than one millisecond.

Example 18. The method of any of examples 11-17, wherein the rectified noisy demodulated digital cosine signal includes first in band noise, wherein the rectified noisy modulated digital sine signal includes second in band noise, and wherein executing the first trained machine learning model comprises executing the first trained machine learning model that is configured to remove the first in band noise from the rectified noisy modulated or demodulated digital cosine signal and the second in band noise from the rectified noisy modulated or demodulated digital sign signal to obtain the demodulated digital cosine signal and the demodulated digital sign signal.

Example 19. The method of any of examples 11-18, wherein computing the approximate angle of the rotating element comprises computing an arctangent of the demodulated digital cosine signal and the demodulated digital sine signal to obtain the approximate angle of the rotating element.

Example 20. A system comprising: a rotating element; a resolver sensor attached to the rotating element; and a microcontroller communicatively coupled to the resolver sensor and configured to control the rotating element, the microcontroller comprising: a delta-sigma analog-to-digital converter electrically coupled to the resolver sensor, the delta-sigma analog-to-digital converter configured to obtain, based on electrical interactions with the resolver sensor, a noisy modulated digital cosine signal for an indirectly sensed angle of the rotating element and a noisy modulated digital sine signal for the indirectly sensed angle of the rotating element; one or more filters configured to process the noisy modulated digital cosine signal and the noisy modulated digital sine signal to output a filtered noisy modulated digital cosine signal and a filtered noisy modulated digital sine signal; one or more rectifiers configured to process the filtered noisy modulated digital cosine signal and the filtered noisy modulated digital sine signal to output a rectified noisy modulated digital cosine signal and a rectified noisy modulated digital sine signal; and a digital signal processor configured to: execute a first trained machine learning model that processes the rectified noisy modulated digital cosine signal and the rectified noisy modulated digital sign signal to obtain a demodulated digital cosine signal and a demodulated digital sign signal; and compute, based on the demodulated digital cosine signal and the demodulated digital sine signal, an approximate angle of the rotating element.

Various examples have been described. These and other examples are within the scope of the following claims.

What is claimed is:

1. Processing circuitry comprising:

an analog-to-digital converter electrically coupled to a resolver sensor attached to a rotating element controlled by the processing circuitry, the analog-to-digital converter configured to obtain, based on electrical interactions with the resolver sensor, a noisy modulated digital cosine signal for an indirectly sensed angle of the rotating element and a noisy modulated digital sine signal for the indirectly sensed angle of the rotating element;

one or more filters configured to process the noisy modulated digital cosine signal and the noisy modulated digital sine signal to output a filtered noisy modulated digital cosine signal and a filtered noisy modulated digital sine signal;

one or more rectifiers configured to process the filtered noisy modulated digital cosine signal and the filtered noisy modulated digital sine signal to output a rectified noisy modulated digital cosine signal and a rectified noisy modulated digital sine signal; and a digital signal processor configured to:

execute a first trained machine learning model that processes the rectified noisy modulated digital cosine signal and the rectified noisy modulated digital sine signal to obtain a demodulated digital cosine signal and a demodulated digital sine signal; and compute, based on the demodulated digital cosine signal and the demodulated digital sine signal, an approximate angle of the rotating element.

2. The processing circuitry of claim 1, wherein the one or more filters comprises a cyclic integrating comb filter that downsamples the noisy modulated digital cosine signal and the noisy modulated digital sine signal to output a down-sampled digital cosine signal as the filtered noisy modulated digital cosine signal and a downsampled digital sine signal as the filtered noisy modulated digital cosine signal.

3. The processing circuitry of claim 1, further comprising one or more integrators, wherein the one or more rectifiers output the rectified noisy modulated digital cosine signal and the rectified noisy modulated digital sine signal to the one or more integrators, and wherein the one or more integrators process the rectified noisy modulated digital cosine signal and the rectified noisy modulated digital sine signal to output an integrated noisy modulated or demodulated digital cosine signal and an integrated noisy modulated or demodulated digital sine signal to the digital signal processor as the rectified noisy modulated or demodulated digital cosine signal and the rectified noisy modulated or demodulated digital sine signal.

4. The processing circuitry of claim 1, wherein the first trained machine learning model comprises an autoencoder neural network or a transformer.

5. The processing circuitry of claim 1, wherein the digital signal processor is further configured to execute a second trained machine learning model that processes the demodulated digital cosine signal and the demodulated digital sine signal to obtain an approximate velocity of the rotating element.

6. The processing circuitry of claim 5, wherein second trained machine learning model comprises a multi-layer perceptron.

7. The processing circuitry of claim 1, wherein the processing circuitry resolves the approximate angle of the rotating element in less than one millisecond.

8. The processing circuitry of claim 1, wherein the rectified noisy demodulated digital cosine signal includes first in band noise, wherein the rectified noisy modulated digital sine signal includes second in band noise, and wherein the first trained machine learning model removes the first in band noise from the rectified noisy modulated or demodulated digital cosine signal and the second in band noise from the rectified noisy modulated or demodulated digital sine signal to obtain the demodulated digital cosine signal and the demodulated digital sine signal.

9. The processing circuitry of claim 1, wherein the digital signal processor, to compute the approximate angle of the rotating element, computes an arctangent of the demodulated digital cosine signal and the demodulated digital sine signal to obtain the approximate angle of the rotating element.

10. The processing circuitry of claim 1, wherein the processing circuitry comprises a microcontroller.

11. A method comprising:

obtaining, by a delta-sigma analog-to-digital converter of a microcontroller, and based on electrical interactions with a resolver sensor, a noisy modulated digital cosine signal for an indirectly sensed angle of a rotating element and a noisy modulated digital sine signal for the indirectly sensed angle of the rotating element;

processing, by one or more filters of the microcontroller, the noisy modulated digital cosine signal and the noisy modulated digital sine signal to output a filtered noisy modulated digital cosine signal and a filtered noisy modulated digital sine signal;

processing, by one or more rectifiers of the microcontroller, the filtered noisy modulated digital cosine signal and the filtered noisy modulated digital sine signal to output a rectified noisy modulated digital cosine signal and a rectified noisy modulated digital sine signal;

executing, by a digital signal processor of the microcontroller, a first trained machine learning model that processes the rectified noisy modulated digital cosine signal and the rectified noisy modulated digital sine signal to obtain a demodulated digital cosine signal and a demodulated digital sine signal; and computing, by the digital signal processor, and based on the demodulated digital cosine signal and the demodulated digital sine signal, an approximate angle of the rotating element.

12. The method of claim 11, wherein the one or more filters comprise a cyclic integrating comb filter, and wherein processing the noisy modulated digital cosine signal and the noisy modulated digital sine signal comprises downsampling, by the cyclic integrating comb filter, the noisy modulated digital cosine signal and the noisy modulated digital sine signal to output a downsampled digital cosine signal as the filtered noisy modulated digital cosine signal and a downsampled digital sine signal as the filtered noisy modulated digital cosine signal.

13. The method of claim 11, further comprising processing, by one or more integrators, the rectified noisy modulated digital cosine signal and the rectified noisy modulated digital sine signal to output an integrated noisy modulated or demodulated digital cosine signal and an integrated noisy modulated or demodulated digital sine signal to the digital signal processor as the rectified noisy modulated or demodulated digital cosine signal and the rectified noisy modulated or demodulated digital sine signal.

14. The method of claim 11, wherein the first trained machine learning model comprises an autoencoder neural network or a transformer.

15. The method of claim 11, further comprising executing a second trained machine learning model that processes the demodulated digital cosine signal and the demodulated digital sine signal to obtain an approximate velocity of the rotating element.

16. The method of claim 15, wherein second trained machine learning model comprises a multi-layer perceptron.

17. The method of claim 11, wherein resolving the approximate angle comprises resolving the approximate angle of the rotating element in less than one millisecond.

18. The method of claim 11, wherein the rectified noisy demodulated digital cosine signal includes first in band noise, wherein the rectified noisy modulated digital sine signal includes second in band noise, and wherein executing the first trained machine learning model comprises executing the first trained machine learning model that is configured to remove the first in band noise from the rectified noisy modulated or demodulated digital cosine signal and the second in band noise from the rectified noisy modulated or demodulated digital sine signal to obtain the demodulated digital cosine signal and the demodulated digital sine signal.

19. The method of claim 11, wherein computing the approximate angle of the rotating element comprises computing an arctangent of the demodulated digital cosine signal and the demodulated digital sine signal to obtain the approximate angle of the rotating element.

20. A system comprising:

a rotating element;

a resolver sensor attached to the rotating element; and a microcontroller communicatively coupled to the resolver sensor and configured to control the rotating element, the microcontroller comprising:

a delta-sigma analog-to-digital converter electrically coupled to the resolver sensor, the delta-sigma analog-to-digital converter configured to obtain, based on electrical interactions with the resolver sensor, a noisy modulated digital cosine signal for an indirectly sensed angle of the rotating element and a noisy modulated digital sine signal for the indirectly sensed angle of the rotating element;

one or more filters configured to process the noisy modulated digital cosine signal and the noisy modulated digital sine signal to output a filtered noisy modulated digital cosine signal and a filtered noisy modulated digital sine signal;

one or more rectifiers configured to process the filtered noisy modulated digital cosine signal and the filtered noisy modulated digital sine signal to output a rectified noisy modulated digital cosine signal and a rectified noisy modulated digital sine signal; and a digital signal processor configured to:

execute a first trained machine learning model that processes the rectified noisy modulated digital cosine signal and the rectified noisy modulated digital sine signal to obtain a demodulated digital cosine signal and a demodulated digital sine signal; and compute, based on the demodulated digital cosine signal and the demodulated digital sine signal, an approximate angle of the rotating element.

* * * * *